(12) United States Patent
Louie et al.

(10) Patent No.: US 7,707,368 B2
(45) Date of Patent: *Apr. 27, 2010

(54) MEMORY DEVICE TRIMS

(75) Inventors: Benjamin Louie, Fremont, CA (US); Aaron Yip, Santa Clara, CA (US); Jin-Man Han, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/246,606

(22) Filed: Oct. 7, 2008

(65) Prior Publication Data

US 2009/0043975 A1 Feb. 12, 2009

Related U.S. Application Data

(63) Continuation of application No. 10/894,242, filed on Jul. 19, 2004, now Pat. No. 7,447,847.

(51) Int. Cl.
G06F 12/00 (2006.01)

(52) U.S. Cl. .......... 711/154; 365/185.22; 711/E12.001

(58) Field of Classification Search ............... 711/154; 365/185.22
See application file for complete search history.

(56) References Cited

U.S. PATENT DOCUMENTS

| | | | |
|---|---|---|---|
| 5,615,159 A | 3/1997 | Roohparvar | |
| 5,627,784 A | 5/1997 | Roohparvar | |
| 5,801,985 A | 9/1998 | Roohparvar et al. | |
| 5,802,598 A | 9/1998 | Watt | |
| 5,930,358 A | 7/1999 | Rao | |
| 6,163,225 A | 12/2000 | Sundaram | |
| 6,263,399 B1 | 7/2001 | Hwang | |
| 6,269,027 B1 | 7/2001 | Hurst, Jr. et al. | |
| 6,363,454 B1 | 3/2002 | Lakhani et al. | |
| 6,614,689 B2 | 9/2003 | Roohparvar | |
| 6,629,047 B1 | 9/2003 | Guliani | |
| 6,740,984 B2 | 5/2004 | Tay et al. | |
| 6,977,410 B2 | 12/2005 | Naso et al. | |
| 2002/0144103 A1 | 10/2002 | Kendall | |
| 2003/0031056 A1 | 2/2003 | Roohparvar | |
| 2004/0246773 A1 | 12/2004 | Naso et al. | |
| 2005/0280072 A1 | 12/2005 | Naso et al. | |
| 2006/0256620 A1 | 11/2006 | Nguyen et al. | |

*Primary Examiner*—Reginald G Bragdon
*Assistant Examiner*—Larry T Mackall
(74) *Attorney, Agent, or Firm*—Leffert Jay & Polglaze, P.A.

(57) ABSTRACT

Methods and apparatus are provided. A memory device has a memory array, base trim circuitry adapted to store base control parameter values common to the memory array, and a reference trim circuit corresponding to a portion of the memory array. The reference trim circuit is adapted to store one or more reference control parameter values for respectively correcting one or more of the base control parameter values of the base trim circuitry for application to the portion of the memory array. The memory device may include an index circuit corresponding to the reference trim circuit. The index circuit is adapted to store one or more index parameter values for respectively selecting the one or more base control parameter values of the base trim circuitry for correction by the one or more reference control parameter values of the reference trim circuit.

20 Claims, 3 Drawing Sheets

MEMORY DEVICE TRIMS

RELATED APPLICATION

This Application is a Continuation of U.S. application Ser. No. 10/894,242, titled "MEMORY DEVICE TRIMS," filed Jul. 19, 2004 now U.S. Pat. No. 7,447,847, (Allowed) which is commonly assigned and incorporated herein by reference.

FIELD

The present invention relates generally to memory devices and in particular the present invention relates to memory device trims.

BACKGROUND

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

NOR and NAND flash memory devices are two common types of flash memory devices, so called for the logical form the basic memory cell configuration in which each is arranged. Typically, for NOR flash memory devices, the control gate of each memory cell of a row of the array is connected to a word line, and the drain region of each memory cell of a column of the array is connected to a bit line. The memory array for NOR flash memory devices is accessed by a row decoder activating a row of floating gate memory cells by selecting the word line connected to their control gates. The row of selected memory cells then place their data values on the column bit lines by flowing a differing current, depending upon their programmed states, from a connected source line to the connected column bit lines.

The array of memory cells for NAND flash memory devices is also arranged such that the control gate of each memory cell of a row of the array is connected to a word line. However, each memory cell is not directly connected to a column bit line by its drain region. Instead, the memory cells of the array are arranged together in strings (often termed NAND strings), e.g., of 32 each, with the memory cells connected together in series, source to drain, between a source line and a column bit line. The memory array for NAND flash memory devices is then accessed by a row decoder activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the source line to the column bit line through each series connected string, restricted only by the selected memory cells of each string. This places the current-encoded data values of the row of selected memory cells on the column bit lines.

Memory devices usually include trim circuits that are programmed to output bit values used to provide a variety of options for algorithms that control the operations of the memory device, such algorithm options may include timing, pulse counts, applied voltage levels, etc. The bit values are usually programmed once for a memory device and are rarely changed once the memory device has reached production. Moreover, the bit values are usually applied globally to an entire memory array, which can include thousands of memory blocks, especially for NAND devices. However, as memory array sizes increase, applying the bit values globally to an entire memory array may not be sufficient.

For the reasons stated above, and for other reasons stated below which will become apparent to those skilled in the art upon reading and understanding the present specification, there is a need in the art for alternative trimming methods.

DETAILED DESCRIPTION

Figure 1:
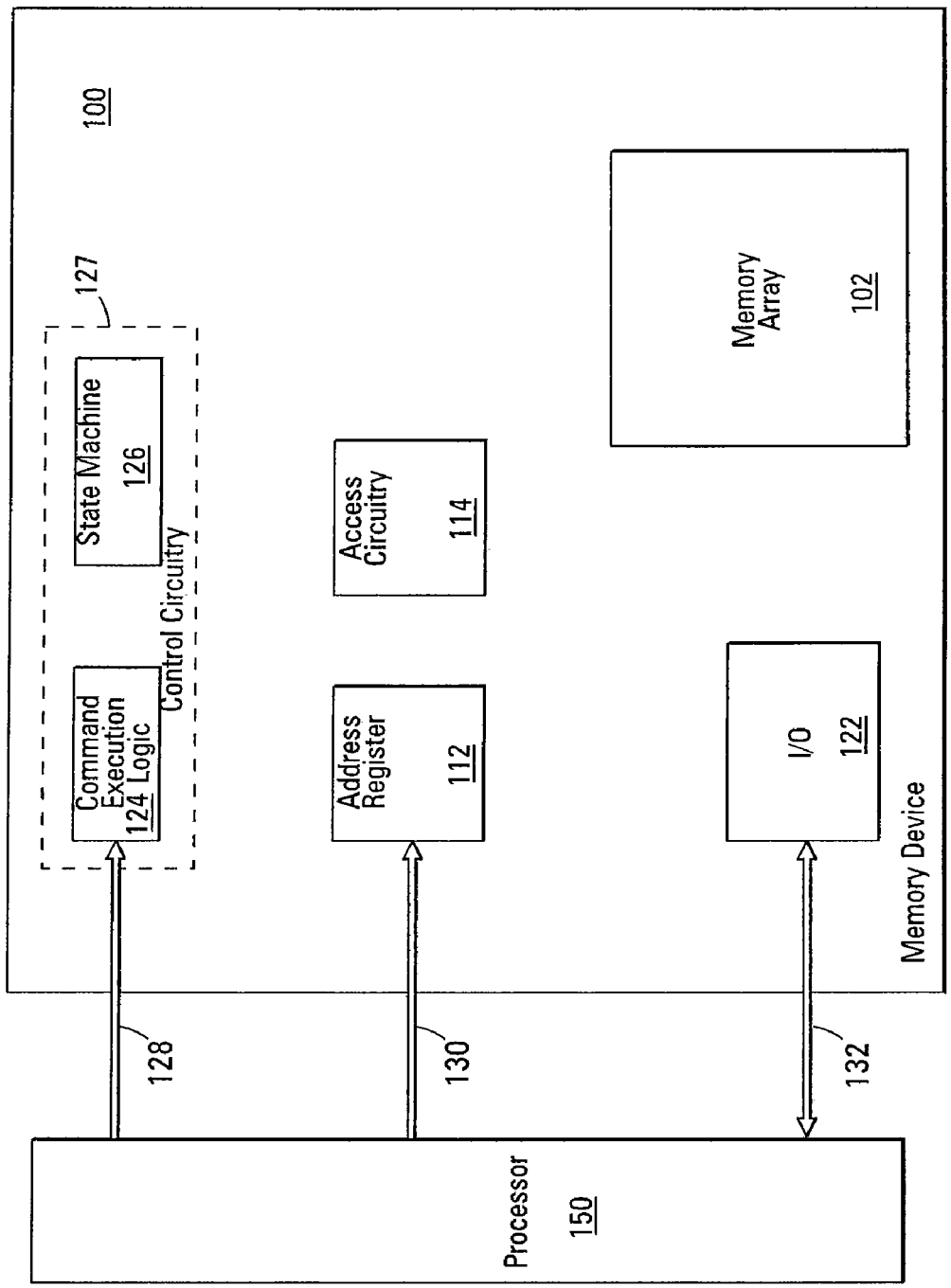
FIG. 1 is a block diagram illustration of memory system, according to an embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 is a block diagram illustration of a memory system, according to an embodiment of the present invention. The memory system includes a memory device 100, such as a flash memory device, e.g., NAND or NOR flash. Memory device 100 includes a memory array 102 having a plurality of memory cells arranged in row and column fashion. For one embodiment, each of the memory cells includes a floating-gate field-effect transistor capable of holding a charge for the non-volatile storage of data. Each of the cells can be electrically programmed on an individual basis by charging the floating gate.

The rows of memory array 102 are arranged in blocks, where a memory block is some discrete portion of the memory array 102. Individual word lines generally extend to only one memory block, while bit lines may extend to multiple memory blocks. The memory cells generally can be erased in blocks. Data, however, may be stored in the memory array 102 separate from the block structure.

For one embodiment, memory array 102 is a NOR flash memory array. A control gate of each memory cell of a row of the array is connected to a word line, and a drain region of each memory cell of a column of the array is connected to a bit line. The memory array for NOR flash memory devices is accessed by row access circuitry, such as row access circuitry of access circuitry 114 of memory device 102, activating a row of floating gate memory cells by selecting the word line connected to their control gates. The row of selected memory cells then place their data values on the column bit lines by flowing a differing current, depending upon their programmed states, from a connected source line to the connected column bit lines.

For another embodiment, memory array 102 is a NAND flash memory array also arranged such that the control gate of each memory cell of a row of the array is connected to a word line. However, each memory cell is not directly connected to a column bit line by its drain region. Instead, the memory cells of the array are arranged together in strings (often termed NAND strings), e.g., of 32 each, with the memory cells connected together in series, source to drain, between a source line and a column bit line. The memory array for NAND flash memory devices is then accessed by row access circuitry, such as row of access circuitry 114 of memory device 102, activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the source line to the column bit line through each series connected string, restricted only by the selected memory cells of each string. This places the current-encoded data values of the row of selected memory cells on the column bit lines.

Memory array 102 can be accessed using externally provided location addresses received by an address register 112 via address signal connections 130. The address signals are decoded, and one or more target memory cells are selected in response to the decoded address signals, using the access circuitry 114 that includes decode and select circuitry.

Data is input and output through an I/O circuit 122 via data connections 132. I/O circuit 122 includes data output registers, output drivers and output buffers. Command execution logic 124 is provided to control the basic operations of the memory device 100 in response to control signals received via control signal connections 128. A state machine 126 may also be provided to control specific operations performed on the memory array and the memory cells. The command execution logic 124 and/or state machine 126 can be generally referred to as control circuitry 127 to control read, write, erase and other memory operations. The control circuitry 127 is adapted to facilitate the methods of the various embodiments. The data connections 132 are typically used for bi-directional data communication. The memory can be coupled to an external processor 150 for operation. An example of a processor 150 includes a memory controller in a personal computer.

It will be appreciated by those skilled in the art that additional circuitry and control signals can be provided, and that the memory device of FIG. 1 has been simplified to help focus on the invention. It will further be understood that the above description of a memory device is intended to provide a general understanding of the memory and is not a complete description of all the elements and features of a typical memory device.

Figure 2:
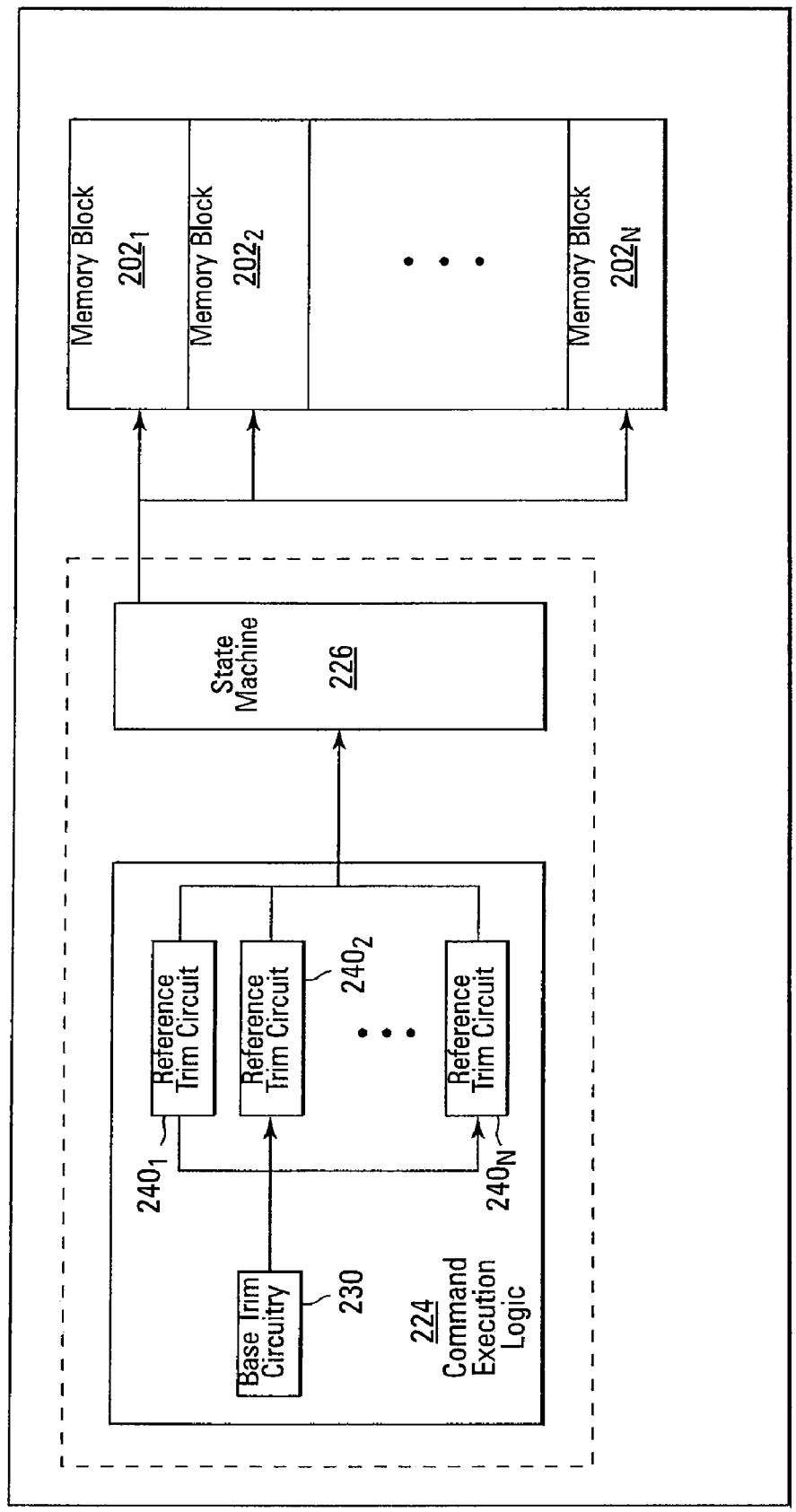
FIG. 2 is a block diagram of a portion of a memory device, according to another embodiment of the present invention.

FIG. 2 is a block diagram of a portion of a memory device, such as the memory device 100 of FIG. 1, according to another embodiment of the present invention. For example, the memory array 102 of memory device 100 may include memory blocks $202_1$ to $202_N$, shown in FIG. 2, and the control circuitry 127 of memory device 100 may include a state machine 226 that in one embodiment, includes high-voltage generation circuitry, and command execution logic 224, shown in FIG. 2. For one embodiment, command execution logic 224 includes base (or global) trim circuitry 230 coupled to reference (or local) trim circuits $240_1$ to $240_N$ that respectively correspond to memory blocks $202_1$ to $202_N$. Reference trim circuits 240 are coupled to state machine 226 that is, in turn, coupled to each of the memory blocks 202.

Base trim circuitry 230 may include fusible elements, such as fuses and/or anti-fuses, and/or other non-volatile storage elements adapted to store base (or global) control parameter values (or base bit or base trim values) common to each of memory blocks 202 and used by state machine 226 for controlling operations on memory blocks 202. Such base control parameters may include, for example, parameters for adjusting the magnitude and duration of voltage pulses applied to memory blocks 202, or portions thereof, for carrying out programming and erasing operations. Reference (or local) trim circuits 240 may also include non-volatile storage elements adapted to store reference (or local) control parameter values (or reference bit or reference trim values) for correcting, e.g., modifying (adjusting up or down), replacing, or supplementing, the base control parameter values. For some embodiments, the reference control parameter values correspond to a magnitude and a direction of the correction applied to the base control parameter values.

In operation, state machine 226 respectively corrects one or more base control parameter values according to one or more reference control parameter values of a trim circuit 240 (e.g., trim circuit $240_1$) and controls and/or accesses the memory block (e.g., memory block $202_1$), via access circuitry of the memory device, corresponding to that trim circuit 240 based on the one or more corrected base control parameter values. Specifically, state machine 226 receives one or more reference control parameter values from one or more of trim circuits 240, receives base control parameter values from base trim circuitry 230, corrects one or more of the base control parameter values according to one or more corresponding reference control parameter values from each of the one or more trim circuits 240, and sets the access circuitry, such as access circuitry 114, according to the corrected base control parameter values to control and/or access the memory blocks respectively corresponding to the one or more trim circuits 240.

For one embodiment, access circuitry 114 is used to control the magnitude and/or duration of voltage pulses of various memory voltages in response to the base control parameter values stored in base trim circuitry 230 and/or the control parameter values stored in base trim circuitry 230 as corrected by the reference control parameter values stored in the reference trim circuits 240. These include, for example, the voltage pulse applied to the array word lines during program operations, to the array word lines during heal operations, and to the source lines of array blocks during erase operations.

More specifically, for one embodiment, access circuitry 114 may have a trim multiplexer that is controlled by the control parameter values stored in base trim circuitry 230 and/or the control parameter values stored in base trim circuitry 230 as corrected by the reference control parameter values stored in the reference trim circuits 240. The multiplexer, in turn, activates transistors (e.g., N-channel transistors) that are respectively connected to a voltage supply. Each activated transistor enables its respective voltage supply to be applied to the memory blocks respectively corresponding to the one or more trim circuits 240, for example.

For other embodiments, one reference trim circuit 240 corresponds to a group of memory blocks 202 instead of a corresponding one of memory blocks 202. For this embodiment, the reference control parameter values of that reference trim circuit 240 are used to modify base control parameter values for the corresponding group of memory blocks. For one embodiment, one of the reference trim circuits 240 corresponds to some portion of one of the memory blocks 202, e.g., an individual word line of one of memory blocks 202. For this embodiment, the reference control parameter values of that reference trim circuit 240 are used to correct base control parameter values for the corresponding word line or word lines.

For other embodiments, base trim circuitry 230 includes base control parameter values that are common to each of memory blocks 202, and each of the local trim circuits 240 includes local control parameter values that are common to a respective one of memory blocks 202. For these embodiments, access circuitry 114 controls the base memory operations of each the memory blocks 202 in response to the base control parameter values and controls operations specific to specific memory blocks 202 in response to the local control parameter values of the respective local trim circuits 240.

Figure 3:
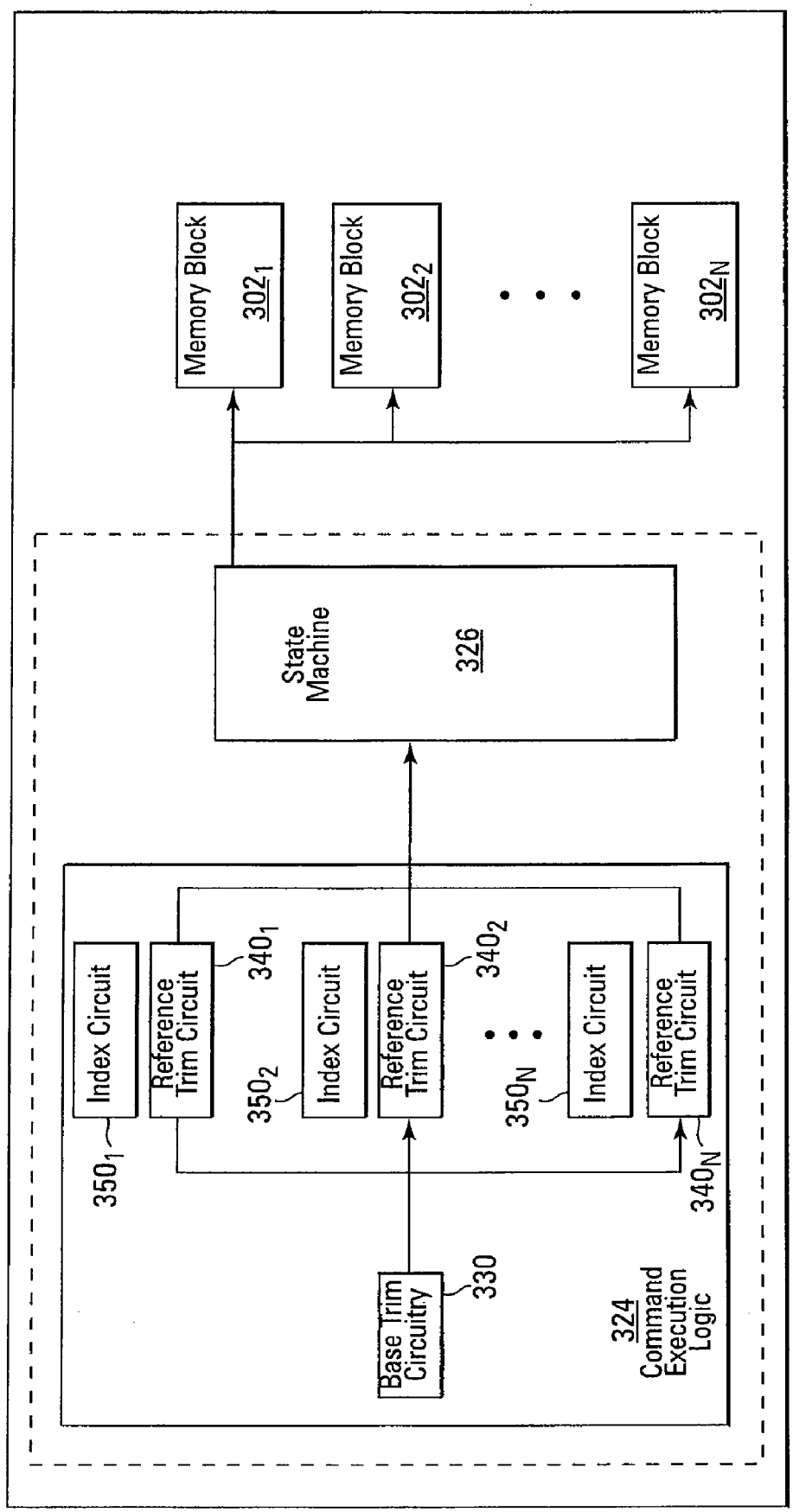
FIG. 3 is a block diagram of a portion of a memory device, according to another embodiment of the present invention.

FIG. 3 is a block diagram of a portion of a memory device, such as the memory device 100 of FIG. 1, according to another embodiment of the present invention. For example, the memory array 102 of memory device 100 may include memory blocks $302_1$ to $302_N$, shown in FIG. 3, and the control circuitry 127 of memory device 100 may include a state machine 326 that in one embodiment, includes high-voltage generation circuitry, and command execution logic 324, shown in FIG. 3. For one embodiment, command execution logic 324 includes base (or global) trim circuitry 330 coupled to reference (or local) trim circuits $340_1$ to $340_N$ that respectively correspond to memory blocks $302_1$ to $302_N$. Reference trim circuits 340 are coupled to state machine 326 that is, in turn, coupled to each of the memory blocks 302. Reference trim circuits $340_1$ to $340_N$ respectively correspond to programmable local index circuits $350_1$ to $350_N$.

Base trim circuitry 330 may include non-volatile storage elements adapted to store base control parameter values (or base trim values) used by state machine 326 for controlling the memory operations. Reference (or local) trim circuits 340 may also include non-volatile storage elements adapted to store reference control parameter values (or reference trim values) for correcting the base control parameter values. Index circuits 350 may include non-volatile storage elements adapted to store index parameter values (or index bit values) for selecting base control parameter values from base trim circuitry 330 to be modified corrected by the reference control parameter values of trim circuits 340 respectively corresponding to the index circuits 350.

In operation, state machine 326 receives an index parameter value from an index circuit 350 (e.g., index circuit $350_1$), a plurality of base control parameter values from base trim circuitry 330, and a reference control parameter value from a trim circuit 340 (e.g., reference trim circuit $340_1$) respectively corresponding to the index circuit 350 that provided the index parameter value. State machine 326 selects a base control parameter value from the plurality of base control parameter values, according to the index parameter value, for correction by the reference control parameter value of the reference trim circuit 340 (e.g., reference trim circuit $340_1$) corresponding to the index circuit 350 (e.g., index circuit $350_1$) that provided that index parameter value. State machine 326 corrects the selected base control parameter value according to that reference control parameter value. State machine 326 then sets the access circuitry, such as access circuitry 114, according to the corrected base control parameter value to control and/or access the memory block (e.g., memory block $302_1$) corresponding to the reference trim circuit 340 containing the reference control parameter value used to correct the base control parameter value.

For other embodiments, one reference trim circuit 340 and its corresponding index circuit 350 correspond to a group of memory blocks 302 instead of one of memory blocks 302. For this embodiment, the index parameter values of that index circuit 350 are used to select the base control parameter values for the corresponding group of memory blocks to be modified by the reference control parameter values of the corresponding reference trim circuit 340. For one embodiment, one reference trim circuit 340 and its corresponding index circuit 350 correspond to some portion of one of the memory blocks 302, e.g., an individual word line of one of memory blocks 302. For this embodiment, the index parameter values of that index circuit 350 are used to select the base control parameter values for the corresponding word line or word lines to be modified by the reference control parameter values of the corresponding reference trim circuit 340.

For various embodiments, base trim circuitry 230 or 330, reference trim circuits 240 or 340, and index circuits 350 are programmed in response to testing a memory device, such as memory device 100, to determine desired values for operating parameters for control and/or access of a memory array, such as memory array 102, of the memory device.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device, comprising:
   a memory array;
   a global trim circuit for storing base control parameter values;
   a plurality of local trim circuits, each local trim circuit of the plurality of local trim circuits corresponding to a respective one of a plurality of mutually exclusive portions of the memory array, each local trim circuit of the plurality of local trim circuits for storing one or more local control parameters;
   a state machine adapted to receive the base control parameter values from the global trim circuit and one or more local control parameters values from at least one of the plurality of local trim circuits, the state machine adapted to use the one or more control parameters of the at least one of the plurality of local trim circuits to correct the base control parameter values for application to the mutually exclusive portion of the memory array corresponding to the at least one of the plurality of local trim circuits.

2. The memory device of claim 1, wherein the global trim circuit and each local trim circuit of the plurality of local trim circuits comprise non-volatile storage elements.

3. The memory device of claim 1, wherein the base control parameter values are used for control and/or access of the memory array.

4. The memory device of claim 1, wherein the one or more local control parameters of each local trim circuit are used for control and/or access of the corresponding mutually exclusive portion of the memory array.

5. A method of operating a memory device, comprising:
selecting one or more base control parameter values corresponding to one or more memory blocks of a memory array of the memory device for correction;
correcting the one or more base control parameter values; and
controlling memory operations on the one or more memory blocks using the corrected one or more base control parameter values;
wherein selecting the one or more base control parameter values comprises selecting the one or more base control parameter values according to index parameter values respectively corresponding to the one or more base control parameter values.

6. The method of claim 5, wherein correcting the one or more base control parameter values comprises modifying, replacing, or supplementing the one or more base control parameter values according to one or more reference control parameter values respectively corresponding to the one or more base control parameter values.

7. The method of claim 6, wherein the one or more base control parameter values are programmed in base trim circuitry of the memory device, the one or more reference control parameter values are programmed in a reference trim circuit of the memory device corresponding to the one or more memory blocks, and the one or more index parameter values are programmed into an index circuit of the memory device corresponding to the reference trim circuit.

8. A method of operating a memory device, comprising:
receiving base control parameter values at a state machine;
receiving first reference control parameter values at the state machine;
receiving second reference control parameter values at the state machine;
correcting the base control parameter values according to the first reference control parameter values at the state machine;
correcting the base control parameter values according to the second reference control parameter values at the state machine;
applying the base control parameter values corrected according to the first reference control parameter values exclusively to a portion of a memory array; and
applying the base control parameter values corrected according to the second reference control parameter values exclusively to an other portion of the memory array.

9. The method of claim 8, wherein correcting the base control parameter values comprises modifying, replacing, or supplementing the base control parameter values.

10. The method of claim 8, wherein the base control parameter values are programmed in base trim circuitry, the first reference control parameter values are programmed in a first reference trim circuit, and the second reference control parameter values are programmed in a second reference trim circuit.

11. A memory device comprising:
a memory array;
base trim circuitry adapted to store base control parameter values;
a reference trim circuit corresponding to a portion of the memory array, the reference trim circuit adapted to store one or more reference control parameter values for respectively correcting one or more of the base control parameter values of the base trim circuitry for application to the portion of the memory array; and
an index circuit corresponding to the reference trim circuit, the index circuit adapted to store one or more index parameter values for respectively selecting the one or more base control parameter values of the base trim circuitry for correction by the one or more reference control parameter values of the reference trim circuit.

12. The memory device of claim 11, further comprising a state machine adapted to receive the base control parameter values from the base trim circuitry and the one or more reference control parameter values from the reference trim circuit, the state machine adapted to correct the base control parameter values using the one or more reference control parameter values.

13. The memory device of claim 11, further comprising an other reference trim circuit corresponding to a word line of an other portion of the memory array and adapted to store one or more other reference control parameter values for respectively correcting one or more of the base control parameter values of the base trim circuitry for application to the word line.

14. The memory device of claim 13, further comprising an other index circuit corresponding to the other reference trim circuit and adapted to store one or more other index parameter values for respectively selecting the one or more of the base control parameter values of the base trim circuitry for modification by the one or more other reference control parameter values of the other reference trim circuit.

15. The memory device of claim 11, further comprising an other reference trim circuit corresponding to an other portion of the memory array, the other reference trim circuit adapted to store one or more other reference control parameter values for respectively correcting one or more of the base control parameter values of the base trim circuitry for application to the other portion of the memory array.

16. The memory device of claim 15, further comprising an other index circuit corresponding to the other reference trim circuit and adapted to store one or more other index parameter values for respectively selecting the one or more of the base control parameter values of the base trim circuitry for correction by the one or more other reference control parameter values of the other reference trim circuit.

17. The memory device of claim 11, wherein the base trim circuitry, the reference trim circuit, and the index circuit each comprise non-volatile storage elements.

18. A memory device comprising:
a memory array;
base trim circuitry adapted to store base control parameter values;
a first reference trim circuit adapted to store one or more first reference control parameter values;
a second reference trim circuit adapted to store one or more second reference control parameter values; and
a state machine adapted to receive the base control parameter values from the base trim circuitry, the one or more first reference control parameters from the first reference trim circuit, and the one or more second reference control parameters from the second reference trim circuit, the state machine adapted to use the one or more first reference control parameters to correct the base control parameter values for application to a first portion of the memory array and to use the one or more second reference control parameters to correct the base control parameter values for application to a second portion of the memory array;
wherein the first and second portions of the memory array are mutually exclusive.

19. The memory device of claim 18, wherein the base control parameter values are common to the first and second portions of the memory array.

20. The memory device of claim 18, wherein the first portion corresponds to one or more first word lines of the memory array and the second portion corresponds to one or more second word lines of the memory array.

* * * * *